(12) United States Patent
Toyoda

(10) Patent No.: US 7,988,886 B2
(45) Date of Patent: Aug. 2, 2011

(54) CONDUCTIVE PATTERN FORMING INK, CONDUCTIVE PATTERN AND WIRING SUBSTRATE

(75) Inventor: Naoyuki Toyoda, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 323 days.

(21) Appl. No.: 12/326,715

(22) Filed: Dec. 2, 2008

(65) Prior Publication Data
US 2009/0148680 A1 Jun. 11, 2009

(30) Foreign Application Priority Data

Dec. 10, 2007 (JP) ................................. 2007-319019

(51) Int. Cl.
H01B 1/20 (2006.01)
(52) U.S. Cl. .................. 252/514; 252/519.3; 252/520.3; 252/521.6; 252/518.1; 106/1.13; 106/1.14; 977/773; 977/775; 977/777; 977/788
(58) Field of Classification Search ....... 252/500–521.6; 106/1.13, 1.14; 977/773, 775, 777, 788
See application file for complete search history.

(56) References Cited

U.S. PATENT DOCUMENTS
6,395,804 B1 *  5/2002 Rao et al. ...................... 523/160
2002/0055562 A1 *  5/2002 Butuc ............................. 524/80
2004/0053041 A1 *  3/2004 Baumoeller et al. .......... 428/326
2004/0234561 A1 * 11/2004 Ansmann et al. ............. 424/401
2005/0106198 A1 *  5/2005 Gotou et al. .................. 424/401
2006/0044382 A1 *  3/2006 Guan et al. .................... 347/105
2006/0079435 A1 *  4/2006 Bigorra Llosas et al. ..... 510/499
2006/0098069 A1 *  5/2006 Cornell et al. ................ 347/101
2007/0105979 A1 *  5/2007 Sun ............................... 523/160
2008/0145546 A1 *  6/2008 Pitt et al. .................... 427/385.5
2009/0291236 A1 * 11/2009 Sasada et al. .................. 428/1.1

FOREIGN PATENT DOCUMENTS
JP      2007-084387 A       4/2007
JP      2008-120863 A       5/2008
WO  WO2007046406 A1 *    4/2007
* cited by examiner Primary Examiner — Mark Kopec
Assistant Examiner — Tri V Nguyen
(74) Attorney, Agent, or Firm — Global IP Counselors, LLP

(57) ABSTRACT

A conductive pattern forming ink for forming a conductive pattern on a substrate by a droplet discharge method includes: metal particles; an aqueous dispersion medium in which the metal particles are dispersed; inositol; and a polyglycerol compound having a polyglycerol skeleton. In the ink, H shown in the following formula (I) is 0.050 to 0.70;

$$H = \frac{OH(A)}{Mw(A)}X(A) + \frac{OH(B)}{Mw(B)}X(B)$$ Formula (I)

where $OH(A)$ represents an average number of hydroxyl groups in one molecule of the polyglycerol compound, $Mw(A)$ represents a weight-average molecular weight of the polyglycerol compound, $X(A)$ represents a content of the polyglycerol compound in the conductive pattern forming ink in weight percent; and $OH(B)$ represents a number of hydroxyl groups in one molecule of the inositol, $Mw(B)$ represents a molecular weight of the inositol, and $X(B)$ represents a content of the inositol in the conductive pattern forming ink in weight percent.

15 Claims, 4 Drawing Sheets

CONDUCTIVE PATTERN FORMING INK, CONDUCTIVE PATTERN AND WIRING SUBSTRATE

The entire disclosure of Japanese Patent Application No. 2007-319019, filed Dec. 10, 2007 is expressly incorporated by reference herein.

BACKGROUND

1. Technical Field

The present invention relates to a conductive pattern forming ink, a conductive pattern, and a wiring substrate.

2. Related Art

Ceramic circuit substrates are widely used as circuit substrates (wiring substrates) on which electronic components are mounted. The ceramic circuit substrates are substrates made of ceramic (ceramic-substrates) on which wiring lines made of metallic materials are provided. Such ceramic circuit substrates are advantageous in that internal components are formed in a multiple-layer manner and finished dimensions are stable because the ceramic constituting the substrates (ceramic substrates) are multifunctional materials.

The ceramic circuit substrates are manufactured as follows. A composition including metal particles is provided on a ceramic formed body made of a material containing ceramic particles and a binder in a pattern corresponding to wiring lines (conductive patterns) to be formed, and then the ceramic formed body to which the composition has been provided is degreased and fired in a sintering step.

As a method for forming a pattern on the ceramic formed body, screen printing is widely employed. The screen printing, however, is disadvantageous in that it is difficult to form fine wiring lines and achieve narrow pitches, and thus hardly satisfies the demand in recent years for highly densified circuit substrates with miniaturized wiring lines (e.g., wiring lines having a line width of 60 μm or less) having a narrow pitch.

Alternatively, a droplet discharge method, what is called an ink-jet method, has recently been proposed as a method for forming a pattern on a ceramic formed body. In the droplet discharge method, a liquid material (a conductive pattern forming ink) including metal particles is discharged from a liquid discharge head as droplets. For example, refer to JP-A-2007-84387.

In this regard, a related art conductive pattern forming ink has a problem in that conductive fine particles are separated out from the ink for forming a conductive pattern due to volatilization of its dispersion medium around a droplet discharge portion of a droplet discharge head (ink-jet head) during a discharge waiting time and a long time continuing discharge. The deposited conductive fine particles around the droplet discharge portion cause changing the paths of discharged droplets, i.e., what is called a flight curve occurs, resulting in problems in that the droplets are hardly landed on a targeted portion and the discharge amount of the droplet is unstable. In addition, in this case, it is difficult that a pattern formed on a substrate by using the related art conductive pattern forming ink has a sufficiently uniformed thickness and width.

When a pattern is formed on a substrate by using the related art ink, cracks easily occur in the pattern in removing a dispersion medium from the formed pattern. As a result, disconnections easily occur in part of the formed conductive pattern. Particularly, such problems frequently occur along with the recent development of highly densified circuit substrates with miniaturized wiring lines having a narrow pitch.

SUMMARY

An advantage of the present invention is to provide a conductive pattern forming ink that can prevent the occurrence of cracks and disconnections in a formed conductive pattern, a conductive pattern exhibiting high reliability, and a wiring substrate having the conductive pattern and exhibiting high reliability.

Such advantage is achieved by the following aspects.

According to a first aspect of the invention, a conductive pattern forming ink for forming a conductive pattern on a substrate by a droplet discharge method, includes: metal particles; an aqueous dispersion medium in which the metal particles are dispersed; inositol; and a polyglycerol compound having a polyglycerol skeleton.

In the ink, H shown in the following formula (I) is 0.050 to 0.70.

$$H = \frac{OH(A)}{Mw(A)}X(A) + \frac{OH(B)}{Mw(B)}X(B) \qquad \text{Formula (I)}$$

where OH(A) represents the average number of hydroxyl groups in one molecule of the polyglycerol compound, Mw(A) represents a weight-average molecular weight of the polyglycerol compound, X(A) represents a content of the polyglycerol compound in the conductive pattern forming ink in weight percent; and OH(B) represents the number of hydroxyl groups in one molecule of the inositol, Mw(B) represents a molecular weight of the inositol, and X(B) represents a content of the inositol in the conductive pattern forming ink in weight percent.

Accordingly, the conductive pattern forming ink can be provided that has an excellent discharge property of droplets thereof and can prevent the occurrence of cracks and disconnections in the formed conductive pattern.

It is preferable that the X(A) and the X(B) satisfy a relation of $0.10 \leq X(A)/X(B) \leq 20$.

Accordingly, the conductive pattern forming ink can maintain its especially-excellent discharge stability for long periods of time so as to be able to more securely prevent the occurrence of cracks and disconnections in forming a conductive pattern.

It is preferable that the X(A) be 1.0 wt % to 20 wt %.

Accordingly, the occurrence of cracks in the conductive pattern is more securely prevented and the viscosity of the conductive pattern forming ink can be made sufficiently low, especially improving the discharge stability of the ink.

It is preferable that the X(B) be 1.0 wt % to 15 wt %.

Accordingly, the discharge stability of the conductive pattern forming ink can be made especially excellent, and the formed conductive pattern can be securely prevented from having a damage caused by crystallization of inositol contained in the ink in forming the conductive pattern.

It is preferable that the polyglycerol compound be polyglycerol.

Accordingly, the occurrence of disconnections and cracks in the formed conductive pattern can be more securely prevented and at the same time, the crystallization of inositol can be more securely prevented.

It is preferable that the Mw(A) be 300 to 3000.

Accordingly, the occurrence of cracks in the pattern can be more securely prevented when the pattern that is formed from the conductive pattern forming ink is dried.

In the conductive pattern forming ink according to the first aspect, it is preferable that a total content of the inositol and the polyglycerol compound in the conductive pattern forming ink be 2.0 wt % to 35 wt %.

Accordingly, the discharge stability of the conductive pattern forming ink can be especially made excellent and the occurrence of cracks and disconnections in forming the conductive pattern can be more securely prevented.

It is preferable that the substrate be formed by degreasing and sintering a ceramic formed body, on which the ink is applied by the droplet discharge method, made of a material containing ceramic particles and a binder so as to have a sheet like shape.

Accordingly, volatilization of the aqueous dispersion medium around a discharge portion of an ink-jet head can be more effectively suppressed and the viscosity of the ink can be made more appropriate, further improving the discharge stability.

It is preferable that the conductive pattern forming ink be a colloidal liquid in which metal colloidal particles composed of the metal particles and a dispersant adsorbing onto surfaces of the metal particles is dispersed in the aqueous dispersion medium.

The conductive pattern forming ink of the aspect can be preferably used for forming a conductive pattern on such ceramic formed body.

It is preferable that the dispersant include hydroxy acid and salt of hydroxy acid having in total three or more of at least one COOH group and at least one OH group, and the number of COOH groups be equal to or larger than the number of OH groups.

Accordingly, a finer conductive pattern can be formed in which the occurrence of cracks and disconnections are more securely prevented.

It is preferable that the dispersant include one of mercapto acid and salt of mercapto acid that have in total two or more of at least one COOH group and at least one SH group.

Accordingly, agglomeration of the metal particles in the conductive pattern forming ink is prevented, so that a finer conductive pattern can be formed in which the occurrence of cracks and disconnections is prevented.

It is preferable that the colloidal liquid have a pH of 6 to 12.

Accordingly, agglomeration of the metal particles in the conductive pattern forming ink is prevented, so that a finer conductive pattern can be formed.

According to a second aspect of the invention, a conductive pattern is formed from the conductive pattern forming ink of the first aspect.

Accordingly, the conductive pattern having high reliability can be provided.

According to a third aspect of the invention, a wiring substrate is provided with the conductive pattern of the second aspect.

Accordingly, the wiring substrate having high reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
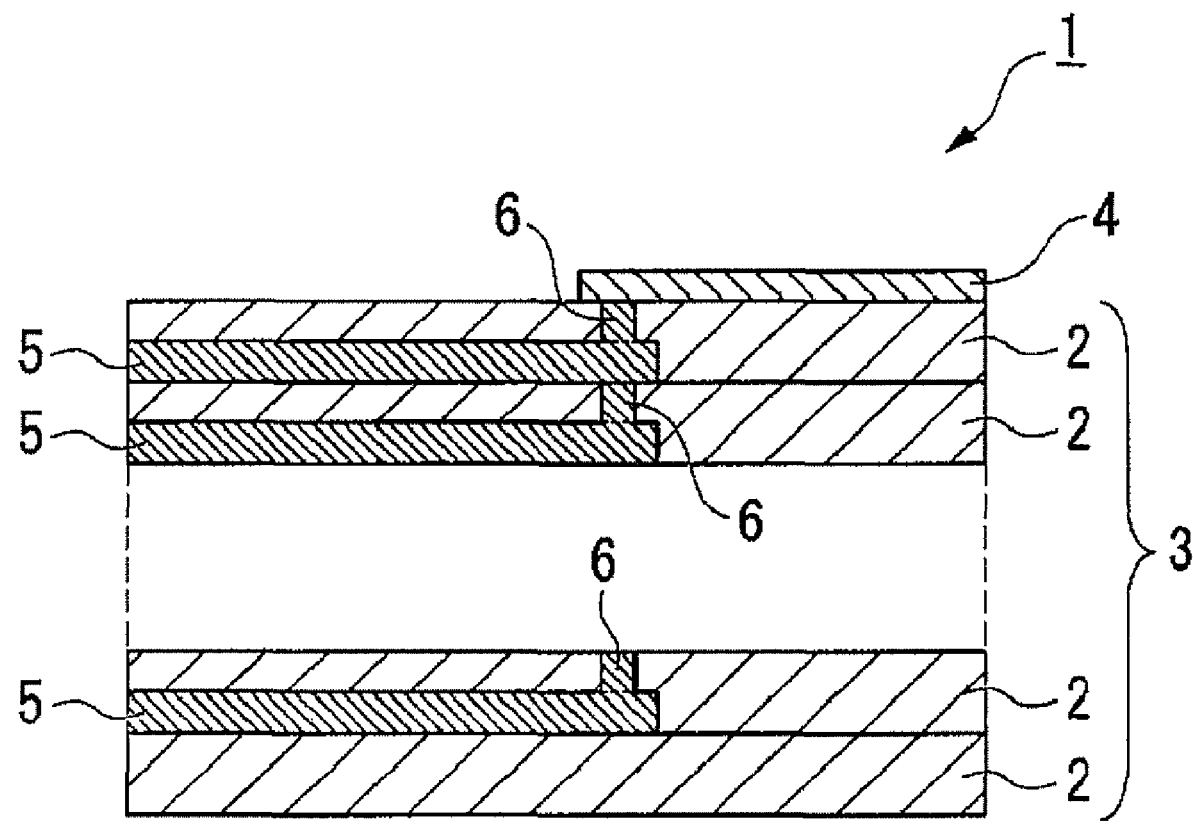
FIG. 1 is a longitudinal sectional view showing an example of a wiring substrate (ceramic circuit substrate) of the invention.

Preferable embodiments of the invention will be described below.

First Embodiment

Conductive Pattern Forming Ink

A conductive pattern forming ink according to a first embodiment of the invention is used for forming a conductive pattern on a substrate, especially used for forming a conductive pattern by a droplet discharge method.

Any substrate may be used as a substrate on which a conductive pattern is formed. However, a ceramic substrate mainly made of ceramic is employed as the substrate in the embodiment. Further, the first embodiment will be explained by exemplifying a case where the conductive pattern forming ink is applied to a ceramic formed body (a ceramic green sheet) made of ceramic and a material containing a binder and having a sheet-like shape. Here, the ceramic formed body and the ink applied to the ceramic formed body undergo a sintering step as described later so as to be a ceramic substrate and a conductive pattern respectively.

The conductive pattern forming ink will now be described. In the embodiment, a case using a dispersion liquid in which silver particles are dispersed will be described as a typical one of dispersion liquids in which metal particles are dispersed in an aqueous dispersion medium.

The conductive pattern forming ink (hereinafter, also referred to as merely an ink) contains an aqueous dispersion medium, silver particles dispersed in the aqueous dispersion medium, a polyglycerol compound having a polyglycerol skeleton, and inositol.

Aqueous Dispersion Medium

The aqueous dispersion medium will be first described.

In the embodiment, the "aqueous dispersion medium" is water and/or a liquid having an excellent compatibility with respect to water (a liquid with a solubility of 30 grams or more per 100 grams of water at 25 degrees Celsius). Thus the aqueous dispersion medium is composed of water and/or the liquid having the excellent compatibility with respect to water, but the aqueous dispersion medium mainly composed of water is preferably used. Especially, the aqueous dispersion medium preferably contains water at a content rate of 70 wt % or more, more preferably at a content rate of 90 wt % or more.

Examples of the aqueous dispersion medium include: water; an alcohol solvent such as methanol, ethanol, butanol, propanol, and isopropanol; an ether solvent such as 1,4-dioxane, and tetrahydrofuran (THF); an aromatic heterocyclic compound solvent such as pyridine, pyrazine, and pyrrole; an amide solvent such as N,N-dimethylformamide (DMF), and N,N-dimethylacetamide (DMA); a nitrile solvent such as acetonitrile; and an aldehyde solvent such as acetoaldehyde. These may be used singly or in combination of two or more.

The content of the aqueous dispersion medium in the conductive pattern forming ink is preferably in the range from 25 wt % to 60 wt %, more preferably from 30 wt % to 50 wt %. Accordingly, the ink is allowed to have a suitable viscosity and to lessen viscosity variation caused by volatilization of the dispersion medium.

Silver Particle

The silver particles (metal particles) will now be described.

The silver particles are a main component of the conductive pattern to be formed and provide conductivity to the conductive pattern.

The silver particles are dispersed in the ink.

The average particle diameter of the silver particles is preferably in the range from 1 nm to 100 nm, more preferably from 10 nm to 30 nm. Accordingly, a discharge property of the ink can be improved and therefore a fine conductive pattern can be easily formed.

The content of the silver particles (silver particles having a surface onto which no dispersant adsorbs) contained in the ink is preferably in the range from 0.50 wt % to 60 wt %, more preferably from 10 wt % to 45 wt %. Accordingly, disconnections of the conductive pattern can be more effectively prevented, being able to provide the conductive pattern having higher reliability.

The silver particles (metal particles) are preferably dispersed in the aqueous dispersion medium as silver colloidal particles (metal colloidal particles) having the surfaces onto which the dispersant adsorbs. Accordingly, the dispersibility of the silver particles with respect to the aqueous dispersion medium is improved, especially improving the discharge property of the ink.

The dispersant preferably includes hydroxyl acid or its salt in which three or more of COOH groups and OH groups in total are included, and the number of COOH groups is same as that of OH groups or more than that. The dispersant adsorbs onto the surfaces of the silver particles so as to form colloidal particles, and evenly disperses the silver colloidal particles in the aqueous solution by electrical repulsion of COOH groups present in the dispersion medium so as to stabilize a colloidal liquid. Thus the silver colloidal particles are stably present in the ink, making it easier to form a fine conductive pattern. In addition, the silver particles are evenly dispersed in the pattern (precursor) formed from the ink, so that cracks, disconnections, and the like do not easily occur. On the other hand, if the total number of COOH groups and OH groups is less than three, or the number of COOH groups is less than that of OH groups, sufficient dispersibility of the silver colloidal particles sometimes can not be obtained.

Examples of such dispersant include: citric acid, malic acid, trisodium citrate, tripotassium citrate, trilithium citrate, ammonium citrate tribasic, disodium malate, tannic acid, gallotannic acid, and gallnut tannin. These may be used singly or in combination of two or more.

Alternatively, mercapto acid or its salt having in total two or more of COOH groups and SH groups may be included in the dispersant. The dispersant forms colloidal particles by the adsorption of mercapto groups onto the surfaces of the silver particles, and evenly disperses the colloidal particles in the aqueous solution by electrical repulsion of COOH groups present in the dispersion medium so as to stabilize a colloidal liquid. Thus the silver colloidal particles are stably present in the ink, making it easier to form a fine conductive pattern. In addition, the silver particles are evenly dispersed in the pattern (precursor) formed from the ink, so that cracks, disconnections, and the like do not easily occur. On the other hand, if the total number of COOH groups and SH groups in the dispersant is less than two, that is, only either one of a COOH group and a SH group is present, sufficient dispersibility of the silver colloidal particles sometimes can not be obtained.

Examples of such dispersant includes: mercaptoacetic acid, mercaptopropionic acid, thiodipropionic acid, mercaptosuccinic acid, thioacetic acid, sodium mercaptoacetate, sodium mercaptopropionate, sodium thiodipropionate, disodium mercaptosuccinate, potassium mercaptoacetate, potassium mercaptopropionate, potassium thiodipropionate, and dipotassium mercaptosuccinate. These may be used singly or in combination of two or more.

The content of the silver colloidal particles in the ink is preferably in the range from about 1 wt % to about 60 wt %, more preferably from about 10 wt % to about 50 wt %. If the content of the silver colloidal particles is less than the lower limit of the range described above, the ink needs to be additionally applied more than once because of a small content of silver in a case where a relatively thick film is formed in forming the conductive pattern. On the other hand, if the content of the silver colloidal particles exceeds the upper limit of the range above, the dispersibility is decreased because of a large content of silver. In this case, the frequency of stirring needs to be increased so as to prevent the decrease of the dispersibility.

The loss on heating, up to 500 degrees Celsius in the thermogravimetric analysis, of the silver colloidal particles is preferably from about 1 wt % to about 25 wt %. If colloidal particles (solid content) are heated up to 500 degrees Celsius, the dispersant adsorbing onto the surfaces, a reducing agent (residual reducing agent) described later, and the like are oxidized and decomposed so as to be mostly gasified and disappear. An amount of the residual reducing agent is seemed to be small, so that it may be considered that the loss on heating up to 500 degrees Celsius nearly corresponds to the amount of the dispersant adsorbing on the silver colloidal particles.

If the loss on heating is less than 1 wt %, the dispersibility of the silver particles is decreased due to a small amount of the dispersant with respect to the silver particles. On the other hand, if the loss on heating exceeds 25 wt %, specific resistance of the conductive pattern is increased due to a large amount of residual dispersant with respect to the silver particles. Here, the specific resistance can be improved to some extent in such manner that the conductive pattern is heated and sintered after it is formed so as to decompose and dissipate an organic component thereof. Therefore, larger improving effect can be obtained in a case of a ceramic substrate, for example, that is sintered in higher temperature.

Forming of the silver colloidal particles will be described later.

Inositol

The conductive pattern forming ink of the first embodiment contains inositol.

Inositol has an excellent moisture-retaining property, and contributes to prevention of volatilization of the dispersion medium of the conductive pattern forming ink. Therefore, the conductive pattern forming ink containing inositol can prevent the volatilization of the dispersion medium contained in the ink so as to prevent increase of the viscosity thereof, even if the ink is preserved for long periods of time. Accordingly, the conductive pattern forming ink can keeps its excellent discharge stability for long periods of time.

Inositol is stable in a state in which it retains a certain amount of moisture. That is, inositol hardly absorbs additional moisture in a state in which it has retained a certain amount of moisture. Here, a pattern—precursor of a conductive pattern, which will be later described in detail,—is formed from the conductive pattern forming ink, and then the aqueous dispersion medium is removed from the pattern. Since inositol is relatively hard to absorb moisture, the resulting pattern is hard to re-absorb moisture. Accordingly, the occurrence of bubbles in the sintering by rapidly vaporizing moisture contained in the formed pattern can securely prevented since little moisture remains in the pattern. As a result, the conductive pattern can be prevented from being damaged by the bubbles produced.

In addition, inositol has a high melting point. Thus, inositol is not easily melted, for example, by heat in forming a laminated body of the ceramic formed body as described later. Accordingly, inositol does not form a large crystal grain in patterns in the laminated body. As a result, the occurrence of cracks in the patterns can be effectively prevented in forming the laminated body. Further, various kinds of binders each having a different glass-transition temperature can be used for the ceramic formed body. That is, the selectivity of material (binder) constituting the ceramic formed body can be improved.

Further, inositol easily burns due to its large number of oxygen per molecular weight so as to be more easily removed (oxidized and decomposed) from the conductive pattern in forming the conductive pattern.

Further, the concentration of inositol increases as the aqueous dispersion medium volatilizes in drying (removing the dispersion medium) the pattern formed form the conductive pattern forming ink. Thus the viscosity of the precursor of the conductive pattern is increased, securely preventing the ink included in the precursor from flowing to an undesired region. Consequently, the conductive pattern can be formed to have a desired shape with high degree of accuracy.

Inositol has 9 isomers, i.e., cis-inositol, epi-inositol, allo-inositol, myo-inositol, muco-inositol, neo-inositol, dextrorotatory of chiro-inositol, levorotatory of chiro-inositol, and scyllo-inositol. Among these, myo-inositol is preferably used in view of ready availability.

A content $X(B)$ [wt %] of inositol in the conductive pattern forming ink is preferably in the range from 1.0 wt % to 15 wt %, more preferably from 2.0 wt % to 10 wt %. Accordingly, the volatilization of the aqueous dispersion medium of the conductive pattern forming ink can be more securely prevented, whereby the conductive pattern forming ink exhibits excellent discharge stability for longer periods of time. In addition, it is securely prevented that inositol in the conductive pattern forming ink is crystallized in forming the conductive pattern and the crystallized inositol damages the formed conductive pattern. If the content of inositol contained in the ink is less than the lower limit of the range mentioned above, the moisture-retaining property of the ink sometimes can not sufficiently increase depending on a composition of the ink. On the other hand, if the content exceeds the upper limit of the range, inositol easily remains in the pattern in the sintering because of its excessive-large amount with respect to the silver particles. As a result, specific resistance of the conductive pattern is increased. The specific resistance can be improved to some extent by controlling the sintering time and the sintering environment. However, inositol is rapidly decomposed and removed at a certain temperature, so that rapid volume constriction occurs depending on a temperature condition in the sintering. The rapid volume constriction sometimes generates cracks, causing conduction defects.

Polyglycerol Compound

The polyglycerol compound prevents the occurrence of cracks in a pattern when the pattern (precursor of the conductive pattern described in detail later) formed from the conductive pattern forming ink is dried (the dispersion medium is removed). This can be considered as follows. If the conductive pattern forming ink contains the polyglycerol compound, polymer chains are present between the silver particles (metal particles), and thus the polyglycerol compound can maintain a distance between the silver particles. Further, since the boiling point of the polyglycerol compound is relatively high, the compound is not removed in removing the aqueous dispersion medium, and adsorbs onto the circumference of the silver particles. Consequently, a state that the polyglycerol compound wraps around the silver particles is kept for long periods of time in removing the aqueous dispersion medium, so that rapid volume constriction caused by the volatilization of the aqueous dispersion medium can be avoided and the grain growth (agglomeration) of silver can be prevented, suppressing the occurrence of cracks in the pattern.

Further, the polyglycerol compound can prevent occurrence of disconnections in the sintering in a process of forming the conductive pattern. This can be considered as follows. The polyglycerol compound has a relatively high boiling point or a relatively high decomposition temperature. Therefore, in the process of forming the conductive pattern from the conductive pattern forming ink, the polyglycerol compound can be evaporated or thermally (oxidatively) decomposed after the aqueous dispersion medium is evaporated.

Further, the polyglycerol compound is present around the silver particles until the polyglycerol compound is evaporated or thermally (oxidatively) decomposed, so as to suppress approach and agglomeration of the silver particles. After the polyglycerol compound is decomposed, the silver particles can be bonded to each other more evenly.

Since the polymer chains (polyglycerol compound) are present between the silver particles (metal particles) in the sintering, the polyglycerol compound can maintain a distance between the silver particles. Further, the polyglycerol compound has an appropriate fluidity. Therefore, if the ink contains the polyglycerol compound, the precursor of the conductive pattern favorably follows expansion and constriction caused by the temperature change of the ceramic formed body.

Thus the occurrence of disconnections in the conductive pattern that is formed can be prevented.

Further, the polyglycerol compound prevents inositol described above from crystallizing. Therefore, even though the ink contains inositol, inositol is prevented from crystallizing in the process of forming the conductive pattern described later so as to prevent damage of the formed conductive pattern. This is seemed to be due to the following reason. Since inositol and the polyglycerol compound that have many hydroxyl groups each other have high affinity to each other, the polyglycerol compound can penetrate between a plurality of molecules of inositol. The penetrated polyglycerol compound prevents inositol from crystallizing.

As described above, inositol has a high affinity with the polyglycerol compound. In addition, inositol has a relatively small molecular weight. Accordingly, inositol penetrates in the molecular chains of the polyglycerol compound in the sintering, resulting in keeping the polyglycerol compound in high fluidity even after the aqueous dispersion medium is removed. Particularly, inositol remains at a relatively high temperature in the sintering without being decomposed since it has a high melting point. Thus inositol allows the polyglycerol compound to keep high fluidity. As a result, the conductive pattern having high reliability is formed since the occurrence of cracks and disconnections in the sintering can be prevented. That is, the occurrence of cracks and disconnections in a pattern serving as the precursor of a conductive pattern can be prevented even though the pattern serving as the precursor is constricted in the sintering since the pattern has a certain fluidity. In the sintering, the ceramic formed body on which the pattern is formed is also expanded and constricted. However, the occurrence of cracks and disconnections in the pattern can be prevented since the pattern has a certain fluidity.

Further, the ink contains such polyglycerol compound, so that the viscosity of the ink can be made appropriate, more effectively improving the discharge stability of the ink from the ink-jet head. In addition, the film-forming property also can be improved.

Examples of the polyglycerol compound may include polyglycerol, polyglycerol ester, and the like that have a polyglycerol skeleton. These may be used singly or in combination of two or more. Examples of polyglycerol ester include: polyglycerol monostearate, polyglycerol tristearate, polyglycerol tetrastearate, polyglycerol monooleate, polyglycerol pentaoleate, polyglycerol monolaurate, polyglycerol monocaprylate, polyglycerol polycinoleate, polyglycerol sesquistearate, polyglycerol decaoleate, and polyglycerol sesquioleate.

Polyglycerol is preferably used among the above. Accordingly, the occurrence of disconnections and cracks can be more securely prevented and at the same time, the crystallization of inositol can be more securely prevented. Further, polyglycerol is preferably used because of its high solubility with respect to the aqueous dispersion medium.

The polyglycerol compound preferably has a weight-average molecular weight in the range from 300 to 3000, more preferably from 400 to 600. Consequently, the occurrence of cracks can be more securely prevented when the pattern that is formed from the conductive pattern forming ink is dried. In addition, inositol can be more securely prevented from crystallizing in forming the conductive pattern. In addition, the polyglycerol compound shows high affinity with inositol, resulting in keeping the pattern formed from the ink in a high fluidity for long periods of time in the sintering. As a result, the pattern favorably follows the expansion and constriction caused by the temperature change of the ceramic formed body. If the weight-average molecular weight of the polyglycerol compound is lower than the lower limit of the range described above, the polyglycerol compound tends to be easily decomposed when the aqueous dispersion medium is removed, decreasing the effect preventing the occurrence of the crystallization of inositol. If the weight-average molecular weight of the polyglycerol compound exceeds the upper limit of the range above, the solubility and the dispersibility in the ink are sometimes decreased due to a removing volume effect and the like.

A content X(A) [wt %] of the polyglycerol compound in the conductive pattern forming ink is preferably 1.0 wt % to 20 wt %, more preferably 3.0 wt % to 15 wt %. Accordingly, the occurrence of cracks and disconnections in the conductive pattern are more securely prevented and the viscosity of the ink can be made sufficiently low, especially improving the discharge stability of the ink. If the content of the polyglycerol compound is lower than the lower limit of the range above and the molecular weight is lower than the lower limit, the effect preventing the occurrence of cracks is sometimes decreased. If the content of the polyglycerol compound exceeds the upper limit of the range above and the molecular weight exceeds the upper limit, the dispersibility of the polyglycerol compound in the ink is sometimes decreased, and therefore it sometimes becomes hard to sufficiently decrease the viscosity of the ink.

In the embodiment of the invention, the conductive pattern forming ink contains inositol and the polyglycerol compound such that H shown in Formula (I) is in the range from 0.050 to 0.70.

$$H = \frac{OH(A)}{Mw(A)}X(A) + \frac{OH(B)}{Mw(B)}X(B) \qquad \text{Formula (I)}$$

(In the formula, OH(A)[piece] represents the average number of hydroxyl groups in one molecule of the polyglycerol compound, Mw(A) represents a weight-average molecular weight of the polyglycerol compound, X(A)[wt %] represents a content of the polyglycerol compound in the conductive pattern forming ink; and OH(B)[piece] represents the number of hydroxyl groups in one molecule of inositol, Mw(B) represents a molecular weight of inositol, and X(B) [wt %] represents a content of inositol in the conductive pattern forming ink.)

As described above, inositol has the excellent moisture-retaining property. Further, the polyglycerol compound also has a relatively high moisture-retaining property. It is considered that the moisture-retaining property of these components heavily depends on the amount of hydroxyl groups. Therefore, the amount of hydroxyl groups of inositol and the polyglycerol compound can be a barometer of the drying property of the conductive pattern forming ink. If H shown in Formula (I) is in the range described above, the aqueous dispersion medium is not easily volatilized, whereby the conductive pattern forming ink exhibits excellent discharge stability. That is, after the ink is put in an ink-jet device, the ink is prevented from increasing its viscosity and being dried around the discharge portion, exhibiting excellent discharge stability of droplets thereof. Accordingly, the variation in weight of droplets of the ink is decreased, resulting in little clogging and little flying failure (flight curve). Consequently, a pattern having an even thickness and even width can be easily formed from the ink, so that the resulting conductive pattern has an even thickness and an even width and hardly has cracks, disconnections, and the like. In particular, even in a case where the inkjet device having the conductive pattern forming ink supplied thereto is left for a predetermined period of time (e.g. 3 days) without being operated, the conductive pattern forming ink according to the invention is accurately discharged in a target position in a uniform amount.

Further, if H is in the range described above, the moisture-retaining property of the conductive pattern forming ink can be prevented from extremely increasing. Accordingly, when the conductive pattern forming ink is applied on a ceramic formed body and the aqueous dispersion medium is removed, moisture residual in the pattern (precursor) that is formed can be made sufficiently small. Further, the pattern can be prevented from absorbing moisture, even after the aqueous dispersion medium is removed. Consequently, occurrence of bubbles formed from the aqueous dispersion medium can be securely prevented in the sintering so as to be able to prevent damage of the conductive pattern that is formed.

From the advantageous effects described above, the conductive pattern formed from the conductive pattern forming ink is prevented from having cracks, disconnections, and the like, and the ink exhibits excellent discharge stability. Therefore, the conductive pattern formed from such ink is highly reliable.

If H shown in Formula (I) is lower than the lower limit of the range described above, the aqueous dispersion medium in the ink is easily volatilized because of low amount of hydroxyl groups in the ink. Consequently, in a case where the ink is discharged for long periods of time or in a case where the ink is put and left in the ink-jet device for long periods of time, the dispersion medium of the conductive pattern forming ink around the discharge portion is easily volatilized so as to increase the viscosity of the ink around the discharge portion. If the viscosity of the ink is increased or the metal particles are agglomerated around the discharge portion, the paths of discharged droplets vary, i.e., what is called a flight curve occurs), resulting in problems in that the droplets are hardly landed on targeted positions and the discharge amount of the droplets is unstable. As a result, the pattern formed from the ink that is discharged on the ceramic formed body has an uneven thickness and an uneven width, so that cracks and disconnections easily occur from a portion having a small thickness and a portion having a small width.

On the other hand, if H shown in Formula (I) exceeds the upper limit of the range above, the moisture-retaining property of the conductive pattern forming ink becomes too high. Therefore, when the conductive pattern forming ink is applied to the ceramic formed body and the aqueous dispersion medium is removed, a large amount of aqueous dispersion medium is left in the formed pattern (precursor). Consequently, when the pattern is sintered, the aqueous dispersion medium rapidly vaporizes so as to produce bubbles. The produced bubbles damage the pattern, causing many cracks and disconnections of the formed conductive pattern. Further, organic substance contained in the conductive pattern forming ink is excessively increased, making it hard that the silver particles bond to each other in the sintering. Furthermore, the moisture-retaining property of the ink becomes excessively high and a fluidity of the pattern formed from the ink becomes high, making it hard to draw a fine pattern. Further, a binder of the ceramic formed body on which the ink is applied is commonly hydrophobic. In such case, adhesiveness between the ink and the ceramic formed body is lowered. Therefore, the pattern (precursor) is easily peeled off from the ceramic formed body or the disconnection easily occurs in a laminating or sintering step of the ceramic formed body described later. Consequently, the conductive pattern having high reliability can not be obtained.

H shown in Formula (I) is in the range described above, but preferably in the range from 0.10 to 0.55, more prominently providing the advantageous effect described above.

Here, in this specification, OH(A) [piece] represents the average number of hydroxyl groups in one molecule in the polyglycerol compound. The average number of hydroxyl groups is calculated by the weighted average based on the content of the polyglycerol compound per molecular weight.

As described above, the conductive pattern forming ink according to the first embodiment of the invention contains inositol and the polyglycerol compound. In a case where the ink contains only one of either inositol or the polyglycerol compound, the advantageous effect of the invention can not be obtained.

In a case where the ink contains no inositol, the aqueous dispersion medium in the ink easily volatilizes, decreasing the discharge stability of droplets of the ink. In a case where the ink contains large amount of polyglycerol compound instead of inositol, the ink contains too many organic substances, increasing the viscosity of the ink. Consequently, the discharge stability of droplets of the ink is decreased.

In a case where the ink contains no polyglycerol compound, inositol is crystallized when the pattern formed from the ink is dried and sintered, whereby the resulting conductive pattern has many cracks and damages. Further, when the pattern formed from the ink is sintered, the pattern is broken due to thermal expansion of the ceramic formed body on which the pattern is formed, causing many disconnections in the formed conductive pattern. Consequently, it becomes hard to obtain a conductive pattern having high reliability.

X(A) and X(B) preferably satisfy $0.50 \leq X(A)/X(B) \leq 20$, more preferably $1.5 \leq X(A)/X(B) \leq 10$. Accordingly, inositol is more securely prevented from crystallizing so as to be able to especially improve the discharge stability of the ink. Further, the moisture-absorption characteristics after drying can be sufficiently lowered while the moisture-retaining property of the ink is made appropriate, whereby the occurrence of cracks, disconnections, and the like can be more securely prevented in forming the conductive pattern.

The total content of inositol and the polyglycerol compound in the conductive pattern forming ink is preferably 2.0 wt % to 35 wt %, more preferably 5.0 wt % to 30 wt %. Accordingly, the viscosity of the ink can be made sufficiently low and the aqueous dispersion medium in the ink can be more securely prevented from volatilizing, especially improving the discharge stability of droplets of the ink. As a result, the occurrence of disconnections, cracks, and the like in the formed conductive pattern can be more securely prevented. Further, the moisture-retaining property of the conductive pattern forming ink can be more easily adjusted, so that the aqueous dispersion medium of the pattern (precursor) that is formed from the ink can be more easily removed and the pattern after the removal of the aqueous dispersion medium can be more securely prevented from adsorbing moisture.

Other Component

Further, the conductive pattern forming ink may contain an acetylene glycol based compound as well as the above-mentioned components. The acetylene glycol based compound adjusts a contact angle between the conductive pattern forming ink and the ceramic formed body so as to set the angle to be in a predetermined range. In addition, a small additive amount of the acetylene glycol based compound can adjust the contact angle between the conductive pattern forming ink and the ceramic formed body so as to set the angle to be in the predetermined range. Further, even if bubbles are mixed in discharged droplets, the bubbles can be removed promptly.

The contact angle between the conductive pattern forming ink and the ceramic formed body is thus adjusted to be in the predetermined range, being able to form a finer conductive pattern.

The compound described above, in particular, adjusts the contact angle between the conductive pattern forming ink and the ceramic formed body to set it to be in the range from 40 degrees to 80 degrees (more preferably, 50 degrees to 80 degrees). If the contact angle is too small, it sometimes becomes hard to form a conductive pattern having a fine line width. On the other hand, if the contact angle is too large, it sometimes becomes hard to form a conductive pattern having an even line width depending on discharging conditions. Further, it sometimes happens that a contact area between landed droplets and the ceramic formed body is too small, and therefore the landed droplets are out of landing positions.

Examples of the acetylene glycol based compound include: Surfynol 104 series (104E, 104H, 104PG-50, 104PA, and the like), Surfynol 400 series (420, 465, 485, and the like), and Olfine series (EXP4036, EXP4001, E1010, and the like) ("Surfynol" is a product name of Air Products and Chemicals, Inc. and "Olfine" is a product name of Nissin Chemical Industry Co., Ltd). These may be used singly or in combination of two or more.

The ink preferably contains two or more kinds of acetylene glycol based compounds having different hydrophile-lipophile balance (HLB) values from each other. Accordingly, the contact angle between the conductive pattern forming ink and the ceramic formed body can be more easily adjusted to be in the predetermined range.

Especially, among two or more of acetylene glycol based compounds contained in the ink, the difference between an HLB value of the acetylene glycol based compound having the highest HLB value and an HLB value of the compound having the lowest HLB value is preferably in the range from 4 to 12, more preferably from 5 to 10. Accordingly, with a smaller additive amount of the acetylene glycol based compound, the contact angle between the conductive pattern forming ink and the ceramic formed body can be adjusted so as to be in the predetermined range.

In a case where the ink containing two or more kinds of acetylene glycol based compounds is used, the HLB value of the acetylene glycol based compound having the highest HLB value is preferably in the range from 8 to 16, more preferably from 9 to 14.

In addition, in a case where the ink containing two or more kinds of acetylene glycol based compounds is used, the HLB value of the acetylene glycol based compound having the lowest HLB value is preferably in the range from 2 to 7, more preferably from 3 to 5.

The content of the acetylene glycol based compound contained in the ink is preferably in the range from 0.001 wt % to 1 wt %, more preferably 0.01 wt % to 0.5 wt %. Accordingly, the contact angle between the conductive pattern forming ink and the ceramic formed body can be more effectively adjusted to be in the predetermined range.

Furthermore, the conductive pattern forming ink may contain 1,3-propanediol as well as the above-mentioned components. Accordingly, the volatilization of the aqueous dispersion medium around the discharge portion of the ink-jet head can be more effectively suppressed and the viscosity of the ink can be made more appropriate, further improving the discharge stability.

In a case where the ink contents 1,3-propanediol, the content of it is preferably 0.50 wt % to 20 wt %, more preferably 2.0 wt % to 10 wt %. Accordingly, the discharge stability of the ink can be more effectively improved.

Here, it should be noted that components of the conductive pattern forming ink are not limited to the above but the ink may contain other components.

For example, the conductive pattern forming ink may contain polyalcohol such as ethylene glycol, 1,3-butylene glycol, 1,3-propanodiol, propylene glycol, and sugar alcohol obtained by reducing aldehyde groups and ketone group of sugar.

Especially, in a case where the conductive pattern forming ink contains at least one of maltitol and lactitol as suger alcohol, inositol can be more securely prevented from crystallizing.

Further, the ink may contain water-soluble polymer such as polyethylene glycol and polyvinyl alcohol. Examples of polyethylene glycol include: polyethylene glycol #200 (weight-average molecular weight of 200), polyethylene glycol #300 (weight-average molecular weight of 300), polyethylene glycol #400 (weight-average molecular weight of 400), polyethylene glycol #600 (weight-average molecular weight of 600), polyethylene glycol #1000 (weight-average molecular weight of 1000), polyethylene glycol #1500 (weight-average molecular weight of 1500), polyethylene glycol #1540 (weight-average molecular weight of 1540), and polyethylene glycol #2000 (weight-average molecular weight of 2000). Examples of polyvinyl alcohol include: polyvinyl alcohol #200 (weight-average molecular weight of 200), polyvinyl alcohol #300 (weight-average molecular weight of 300), polyvinyl alcohol #400 (weight-average molecular weight of 400), polyvinyl alcohol #600 (weight-average molecular weight of 600), polyvinyl alcohol #1000 (weight-average molecular weight of 1000), polyvinyl alcohol #1500 (weight-average molecular weight of 1500), polyvinyl alcohol #1540 (weight-average molecular weight of 1540), and polyvinyl alcohol #2000 (weight-average molecular weight of 2000). These may be singly or in combination of two or more.

Second Embodiment

Method for Producing Conductive Pattern Forming Ink

An example of a method for producing a conductive pattern forming ink such as the ink described above will now be described as a second embodiment of the invention.

In the second embodiment, the conductive pattern forming ink is a colloidal liquid obtained by dispersing silver colloidal particles in an aqueous dispersion medium.

In producing a conductive pattern forming ink, an aqueous solution in which a dispersant and a reducing agent are dissolved is first prepared.

The dispersant is preferably blended in such amount that a molar ratio between silver of silver salt such as silver nitrate which is a starting substance and the dispersant is set to be about 1:1 to about 1:100. If the molar ratio of the dispersant with respect to silver salt is increased, a particle diameter of the silver particles is decreased. Therefore, contact points between the particles in the formed conductive pattern are increased, being able to obtain a film having a low volume-resistance value.

The reducing agent reduces $Ag^+$ ions in silver salt such as silver nitrate ($Ag^+NO^{3-}$) which is a starting substance so as to produce silver particles.

The reducing agent is not especially limited. Examples of the reducing agent includes: amins such as hydrazine, dimethylaminoethanol, methyldiethanolamine, and triethanolamine; hydrogen compounds such as sodium borohydride, hydrogen gas, and hydrogen iodide; oxides such as carbon monoxide, sulfurous acid, and hypophosphorous acid; low-valent metal salts such as Fe(II) compound, and Sn(II) compound; sugars such as D-glucose; organic compounds such as formaldehyde; hydroxy acids such as citric acid, and malic acid; hydroxyacid salts such as trisodium citrate, tripotassium citrate, trilithium citrate, ammonium citrate tribasic, and disodium malate; and tannic acids. Among these, tannic acids and hydroxyl acids function not only as the reducing agent but also the dispersant so as to be preferably used. Preferable examples of the dispersant for forming a stable bond on surfaces of metals include: mercapto acids such as mercaptoacetic acid, mercaptopropionic acid, thiodipropionic acid, mercaptosuccinic acid, and thioacetic acid; and mercaptoacid salts such as sodium mercaptoacetate, sodium mercaptopropionate, sodium thiodipropionate, sodium mercaptosuccinate, potassium mercaptoace tate, potassium mercaptopropionate, potassium thiodipropionate, and potassium mercaptosuccinate. These dispersants and reducing agents may be used singly or in combination of two or more. When any of these compounds is used, the reduction reaction may be promoted with light or heat.

The reducing agent should be blended in such amount that the agent can completely reduce silver salt which is the starting substance. However, it should be blended at a minimum necessary amount, because if the reducing agent is blended excessively, it remains in the silver colloidal liquid as an impurity, causing deterioration of the conductivity after film forming. Specifically, the reducing agent is blended such that a molar-ratio between silver salt and the reducing agent is about 1:1 to about 1:3.

In the second embodiment, after the aqueous solution is prepared by dissolving the dispersant and the reducing agent, a pH of the aqueous solution is preferably adjusted to be 6 to 12.

This is because of the following reasons. For example, in a case where trisodium citrate serving as the dispersant and ferrous sulfate serving as the reducing agent are blended, a pH is about 4 to about 5, that is, lower than 6 which is described above, though it varies depending on the whole concentration. In this case, hydrogen ions shift the equilibrium of the reaction expressed by the following Formula (1) to the right side of the formula, increasing the amount of COOH. Therefore, the electrical repulsion of the surfaces of the silver particles that are obtained by delivering a silver salt solution by drops into the aqueous solution after this mixing is reduced, reducing the dispersibility of the silver particles (colloidal particles).

—COOH⁻+H⁺→—COOH　　　　　　　　　　Formula (1)

Because of this, after the aqueous solution is prepared by dissolving the dispersant and the reducing agent, an alkaline compound is added to the aqueous solution so as to decrease the concentration of hydrogen ions.

The alkaline compound that is added is not especially limited, but sodium hydroxide, potassium hydroxide, lithium hydroxide, ammonia water, and the like can be used. Among these, sodium hydroxide that can easily adjust a pH in small amounts is preferably used.

Here, if a pH exceeds 10 by adding the alkaline compound too much, hydroxide of ions, such as ferric ions, of the reducing agent that remains is easily precipitated.

Next, an aqueous liquid containing silver salt is delivered by drops into the aqueous solution in which the dispersant and the reducing agent that are prepared are dissolved.

Silver salt is not especially limited but may be silver acetate, silver carbonate, silver oxide, silver sulfate, silver nitrite, silver chlorate, silver sulfide, silver chromate, silver nitrate, silver dichromate, for example. Among these, silver nitrate having high solubility with respect to water is preferably used.

Further, the amount of silver salt is determined in view of a desired content of the colloidal particles and a desired reducing ratio by the reducing agent. In a case of silver nitrate, the amount is preferably about 15 pts. wt to about 70 pts. wt with respect to the aqueous solution of 100 pts. wt.

The silver salt aqueous solution is prepared by dissolving above-described silver salt in purified water. Then the silver salt aqueous solution is gradually delivered by drops into the aqueous solution in which the dispersant and the reducing agent described above are dissolved.

In this step, silver salt is reduced by the reducing agent and the dispersant adsorbs onto surfaces of the silver particles so as to form silver colloidal particles. Thus an aqueous solution in which the silver colloidal particles are dispersed is obtained.

The resulting solution contains residues of the reducing agent and the dispersant as well as the colloidal particles, showing a high ionic concentration. In the liquid in such state, coagulation and precipitation easily occur. Therefore, washing is preferably conducted so as to remove extra ions in the aqueous solution and decrease the ionic concentration.

As a method of washing, the following steps are repeated several times, for example: leaving the aqueous solution containing the colloidal particles at rest for a certain period, removing a supernatant solution that is produced from the aqueous solution, adding purified water to the solution and stirring the solution again, further leaving the solution at rest for a certain period, removing a newly produced supernatant solution. A method in which centrifugal separation is conducted instead of the leaving at rest, and a method in which ions are removed by ultrafiltration may be also used.

Alternatively, the following method may be used for washing. After the solution is produced, a pH of the solution is adjusted to be in an acid range that is 5 or less, and the electrical repulsion of the surfaces of the silver particles is reduced by shifting the equilibrium of the reaction expressed in Formula (1) to the right side of the formula so as to conduct the washing in a state that the metal colloidal particles are actively agglomerated. Thus salt and a medium can be removed. The metal colloidal particles that have a sulfuric compound having a low molecular weight, such as mercapto acid, on their surfaces as the dispersant form stable bonds on surfaces of metal. Therefore, if the pH of the solution is adjusted again to be in an alkaline range that is 6 or more, the metal colloidal particles that are agglomerated are easily dispersed again, being able to obtain the metal colloidal liquid exhibiting excellent dispersion stability.

After the above step, it is preferable that an alkali hydroxide metal aqueous solution be added to the aqueous solution in which the silver colloidal particles are dispersed so as to finally adjust the pH to be 6 to 11.

Since the washing is conducted after the reduction, the concentration of sodium that is an electrolyte ion is sometimes decreased. In the solution in such state, the equilibrium of the reaction expressed in the following Formula (2) shifts to the right side of the formula. In such state, the electrical repulsion of the silver colloid is decreased, so that the dispersibility of the silver particles is decreased. Therefore, the equilibrium of the reaction expressed in Formula (2) is shifted to the left side of the formula by adding an appropriate amount of alkali hydroxide, stabilizing the silver colloid.

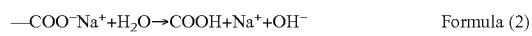

—COO⁻Na⁺+H₂O→COOH+Na⁺+OH⁻　　　　Formula (2)

The alkali hydroxide metal used here may be a compound same as the compound used when the pH is first adjusted, for example.

In the case of a pH that is less than 6, the equilibrium of the reaction expressed in Formula (2) shifts to the right side of the formula, making the colloidal particles unstable. On the other hand, if a pH exceeds 11, hydroxide salt of remaining ions such as a metal ion unfavorably precipitates with ease. Here, if the metal ion is removed in advance, the pH exceeding 11 does not largely affect the precipitation.

Cations such as sodium ions are preferably added in the form of a hydroxide. This is because self protolysis of water can be used so as to be able to most effectively add the cations such as sodium ions to the solution.

By adding other components, such as a dry inhibitor described above, to the aqueous solution, obtained as above, in which the silver colloidal particles are dispersed, a conductive pattern forming ink (the conductive pattern forming ink of the first embodiment) is obtained.

The addition timing of other components such as inositol and the polyglycerol compound is not especially limited. Other components may be added anytime after the silver colloidal particles are formed.

Third Embodiment

Conductive Pattern

A conductive pattern according to a third embodiment of the invention will now be described.

The conductive pattern is formed by applying the ink described above on the ceramic formed body and then heating the ceramic formed body so as to have a thin film shape. On the conductive pattern, the silver particles are bonded to each other. The silver particles are bonded to each other with no space therebetween at least on the surface of the conductive pattern.

Especially, the conductive pattern is formed by using the conductive pattern forming ink of the first embodiment, so that disconnection caused by discharge defects, contact between the conductive patterns that are adjacent to each other, and the like are prevented. Accordingly, the conductive pattern is homogenized without cracks and disconnections so as to be highly reliable.

The conductive pattern of the third embodiment is formed such that the ink described above is applied on the ceramic formed body by the droplet discharge method to form a pattern (precursor), then the formed pattern is dried (the aqueous dispersion medium is removed) and sintered.

As the drying condition, the drying is preferably conducted at 40 degrees Celsius to 100 degrees Celsius, for example, more preferably 50 degrees Celsius to 70 degrees Celsius. Such condition can more effectively prevent the occurrence of cracks when the ink is dried. The sintering is conducted at 160 degrees Celsius or more for 20 minutes or more. The sintering of the pattern can be conducted together with degreasing and sintering of the ceramic formed body.

The specific resistance of the conductive pattern is preferably less than 20 μΩcm, more preferably 15 μΩcm or less. The specific resistance here is a specific resistance after the ink is applied, heated at 160 degrees Celsius, and dried. If the specific resistance becomes 20 μΩcm or more, it becomes hard to use the pattern for a purpose requiring conductivity, that is, to use the pattern for an electrode and the like formed on a circuit substrate.

In forming the conductive pattern of the third embodiment, a conductive pattern having a large film thickness can be formed by repeating the following steps: applying the ink by the droplet discharge method, pre-heating the ink so as to evaporate the dispersion medium such as water, and applying the ink on a film after undergoing the pre-heating.

The polyglycerol compound and the silver colloidal particles remain in the ink after the dispersion medium such as water is evaporated, so that the pattern does not flow even in a state that the pattern formed is not completely dried. Therefore, after the ink is once applied, dried, and left for long periods of time, the ink can be applied again.

In addition, the polyglycerol compound described above is chemically and physically stable. Therefore, even if the ink is left for long periods of time after applied and dried, the ink does not change in quality, whereby the ink can be applied again. Thus a homogeneous pattern can be formed. Therefore, the conductive pattern is not formed as a multilayer structure, so that the increase of the specific resistance, which is caused by the increase of the specific resistance between layers, of the whole of the conductive pattern does not occur.

Through the above-described steps, the conductive pattern of the embodiment can be formed thicker than a conductive pattern formed from a related art ink. In particular, a pattern having the thickness of 5 μm or more can be formed. The conductive pattern of the embodiment is formed from the ink described above. Therefore, even if the pattern is formed to have the thickness of 5 μm or more, the pattern hardly has cracks and has low specific resistance. The upper limit of the thickness is not especially limited. However, if the thickness is too large, the specific resistance may disadvantageously increase due to the difficulty of removing the aqueous dispersion medium, the polyglycerol compound, and the like. Therefore, the thickness is preferably about 100 μm or less.

Further, the conductive pattern of the embodiment has favorable adhesiveness with respect to the substrate described above.

The conductive pattern described above is applicable to a high frequency module of mobile communications equipment such as mobile phones and personal digital assistants (PDAs); interposers; micro electro mechanical systems (MEMS); acceleration sensors; surface acoustic wave elements; dissimilar electrodes such as antennas and comb-teeth electrodes; and electronic components of various types of measurement apparatuses, for example.

Fourth Embodiment

Wiring Substrate and Method for Manufacturing Wiring Substrate

A wiring substrate (ceramic circuit substrate) including a conductive pattern formed from the conductive pattern forming ink of the first embodiment and an example of a method for manufacturing the same will now be described.

A wiring substrate according to a fourth embodiment of the invention is used as an electronic component for various electronic apparatuses. The wiring substrate has circuit patterns including various wiring lines and electrodes, laminated ceramic capacitors, laminated inductors, LC filters, composite high frequency components and the like that are formed on.

Figure 2:
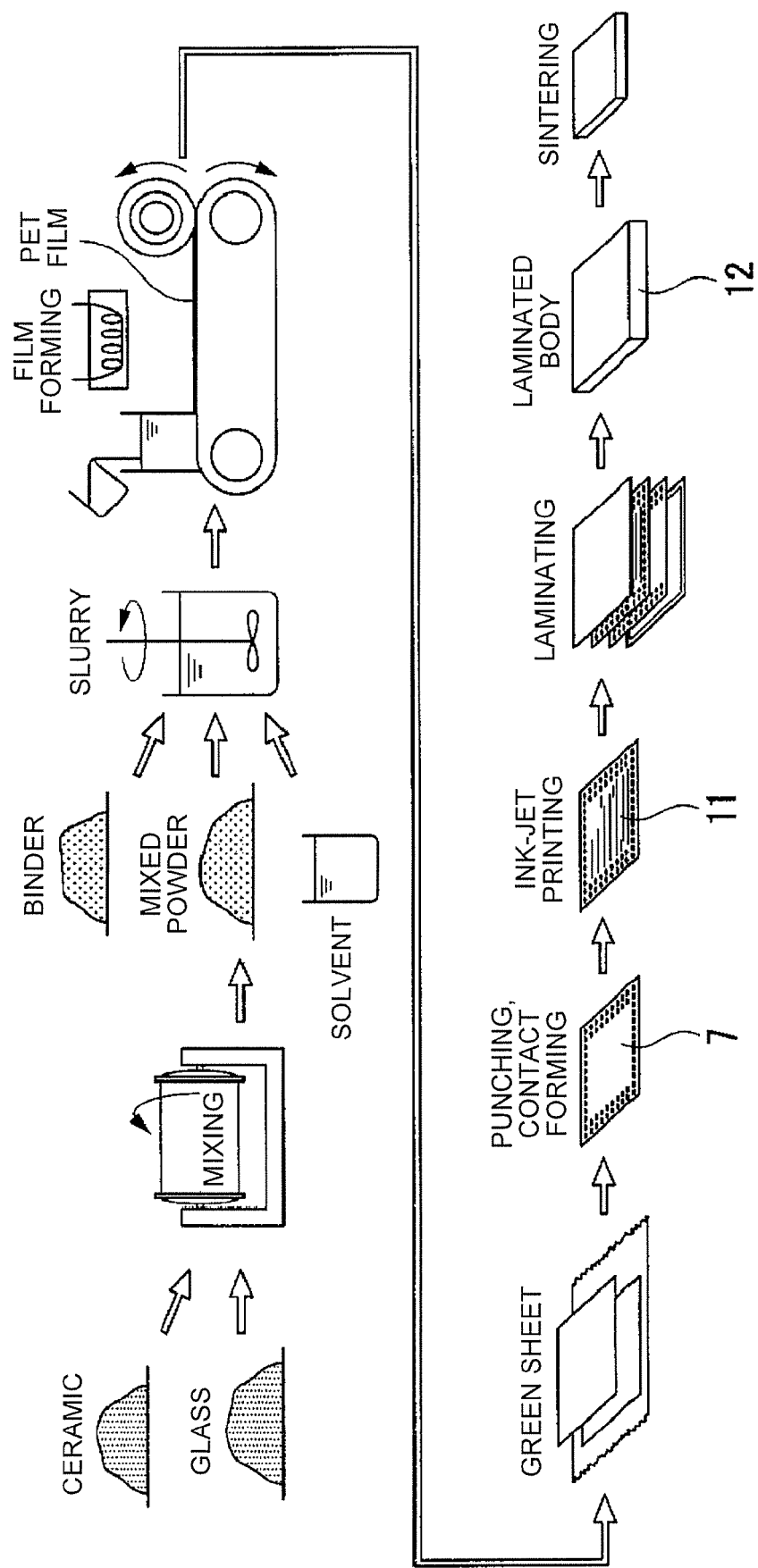
FIG. 2 is an explanatory diagram showing a schematic process of a method for manufacturing a wiring substrate (ceramic circuit substrate) shown in FIG. 1.
Figure 3A:
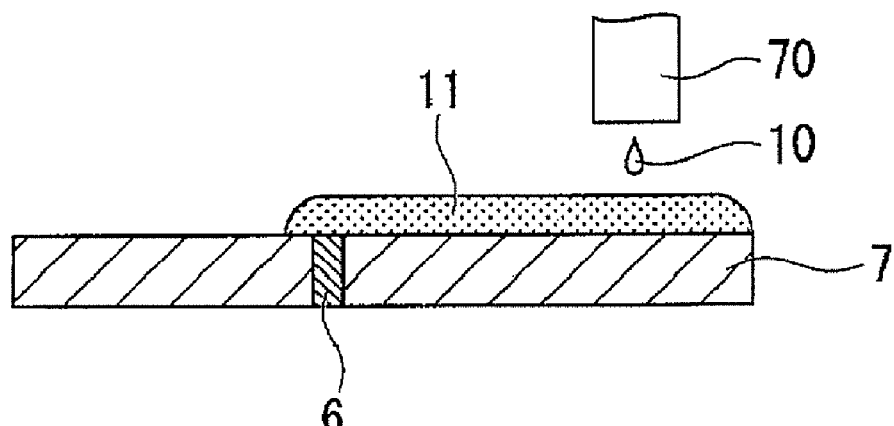
FIGS. 3A and 3B are explanatory diagrams for the manufacturing steps for the wiring substrate (ceramic circuit substrate) shown in FIG. 1.
Figure 3B:
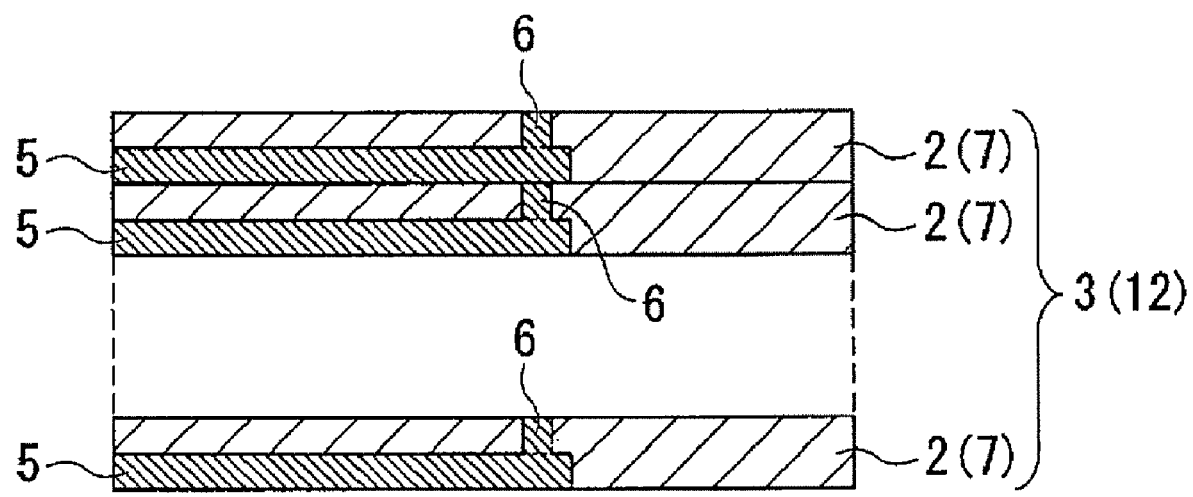
Figure 4:
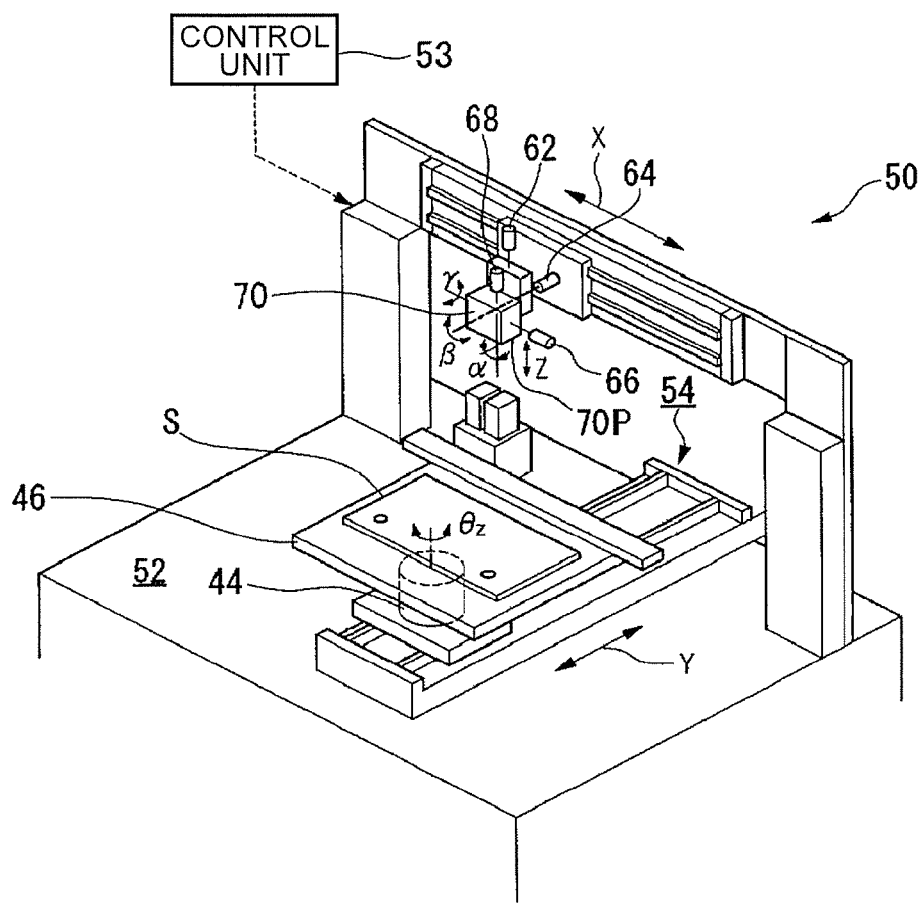
FIG. 4 is a perspective view showing a schematic configuration of an ink-jet device.
Figure 5:
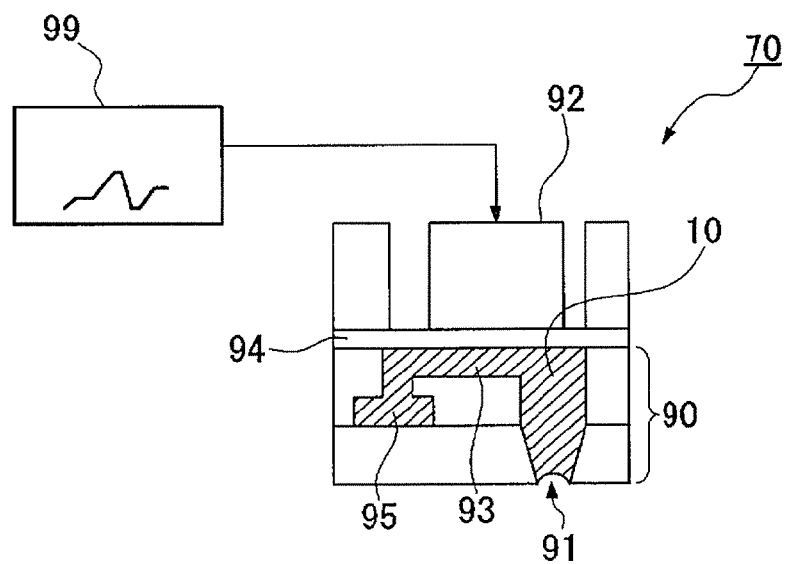
FIG. 5 is a diagram for explaining an outline configuration of an ink-jet head.

FIG. 1 is a longitudinal sectional view showing an example of the wiring substrate (ceramic circuit substrate) according to the fourth embodiment. FIG. 2 schematically shows manufacturing steps for explaining the method for manufacturing the wiring substrate (ceramic circuit substrate) shown in FIG. 1. FIGS. 3A and 3B are explanatory diagrams for the manufacturing steps for the wiring substrate (ceramic circuit substrate) shown in FIG. 1. FIG. 4 is a perspective view schematically showing a configuration of an ink-jet device (droplet discharge device). FIG. 5 is a schematic diagram for explaining an outline configuration of an inkjet head (droplet discharge head).

Referring to FIG. 1, this ceramic circuit substrate (wiring substrate) 1 includes a laminated substrate 3 and a circuit 4. The laminated substrate 3 is composed of a number of ceramic substrates 2 (e.g. from about 10 to 20 sheets) that are laminated. The circuit 4 includes a fine wiring line and the like and formed on an outermost layer of the laminated substrate 3, i.e., one of surfaces of the laminated substrate 3.

The laminated substrate 3 is provided with a circuit (conductive pattern) 5 formed from the conductive pattern forming ink (hereinafter, simply referred to as "ink") between the ceramic circuit substrates 2 that are laminated.

Further a contact (via hole) 6 is formed between the circuits 5 so as to couple the circuits 5 with each other. In this configuration, the contact 6 electrically conducts the circuits 5 disposed one above the other. Further, likewise the circuit 5, the circuit 4 is formed from the conductive pattern forming ink of the first embodiment.

Now, a method for manufacturing the ceramic circuit substrate 1 will be described with reference to FIG. 2 schematically showing the manufacturing steps.

First, a ceramic powder made of alumina ($Al_2O_3$), titanium oxide ($TiO_2$) or the like having an average particle diameter of from about 1 μm to about 2 μm and a glass powder made of borosilicate glass or the like having an average particle diameter of from about 1 μm to about 2 μm are prepared as raw powders and mixed in an appropriate mixing ratio such as a weight ratio of 1:1, for example.

Then, a binder (binding agent), a plasticizer, an organic solvent (dispersant), and the like are appropriately added to the obtained mixed powder and followed by mixing and agitating, providing a slurry. Here, polyvinyl butyral is preferably used as the binder. Polyvinyl butyral is insoluble in water, but soluble in an oil-based organic solvent or easy to swell.

The obtained slurry is formed in a sheet-like shape on a PET film by employing a doctor blade, a reverse coater, or the like so as to be a sheet having a thickness of several micrometers to several hundred micrometers based on manufacturing conditions of a product. Thereafter, the sheet is rolled up.

Subsequently, the sheet is cut as usage of the product, and further, trimmed in a predetermined size. In the fourth embodiment, the sheet is cut out in a square shape having a side length of 200 mm, for example.

Then, a through hole is formed at a predetermined position by using $CO_2$ laser, YAG laser, a mechanical puncher or the like as necessary.

The through hole is filled with a thick-film conductive paste having metal particles dispersed therein, forming a portion to be the contact 6. Further, the thick-film conductive paste is applied by screen printing so as to form a terminal portion (not illustrated) at a predetermined position. Resulting from forming the contact and the terminal portion as above, a ceramic green sheet (ceramic formed body) 7 is obtained. As the thick-film conductive paste, the conductive pattern forming ink of the first embodiment can be used.

Then, on one of the surfaces of the ceramic green sheet 7 obtained as above, a precursor of the circuit 5 which is the conductive pattern of the invention is continuously formed from the contact 6. That is, as shown in FIG. 3A, a conductive pattern forming ink (hereinafter, also simply referred to as "ink") 10 as described above is applied on the ceramic green sheet 7 by a droplet discharge (ink-jet) method, thus forming a precursor 11 that becomes the circuit 5.

In the fourth embodiment, the conductive pattern forming ink is discharged with an ink-jet device (droplet discharge device) 50 shown in FIG. 4 and an ink-jet head (droplet discharge head) 70 shown in FIG. 5, for example. The ink-jet device 50 and the ink-jet head 70 will now be described below.

FIG. 4 is a perspective view illustrating the ink-jet device 50. In FIG. 4, an X direction is the right-and-left direction of a base 52, a Y direction is the back and forth direction, and a Z direction is the up and down direction.

The ink-jet device 50 includes the ink-jet head (hereinafter, simply referred to as "head") 70 and a table 46 on which a substrate S (the ceramic green sheet 7 in the fourth embodiment) is to be placed. An operation of the ink-jet device 50 is controlled by a control unit 53.

The table 46 on which the substrate S is to be placed is allowed to move and to be positioned in the Y direction by a first moving unit 54, and is allowed to oscillate and to be positioned in a θz direction by a motor 44.

On the other hand, the head 70 is allowed to move and to be positioned in the X direction by a second moving unit (not illustrated), and is allowed to move and to be positioned in the Z direction by a linear motor 62. Further, the head 70 is allowed to be oscillated and aligned in α, β, and γ directions, respectively by motors 64, 66, and 68. The ink-jet device 50 configured as above is designed so as to precisely control a relative position and posture between an ink discharging surface 70P of the head 70 and the substrate S on the table 46.

Further, on the back surface of the table 46, a rubber heater (not illustrated) is provided. The rubber heater heats the entire upper surface of the ceramic green sheet 7 placed on the table 46 up to a predetermined temperature.

After the ink 10 lands on the ceramic green sheet 7, at least part of an aqueous dispersion medium in the ink 10 evaporates from the surface. Here, since the ceramic green sheet 7 is heated, the evaporation of the aqueous dispersion medium is accelerated. Then, the ink 10 landed on the ceramic green sheet 7 increases its viscosity from the outer edge of the surface as it is dried. That is, the concentration of solid matter (particles) in the outer circumference reaches a saturated concentration faster than that in the center portion, so that the ink 10 increases its viscosity from the outer edge of the surface. The ink 10 having the viscosity increased at the outer edge stops itself from spreading along the surface direction of the ceramic green sheet 7, thereby facilitating a control of a landed diameter, and further facilitating a control of a line width.

A heating temperature here employs the same condition for drying described above.

The head 70 discharges the ink 10 from a nozzle (protrusion) 91 by an ink-jet method (droplet discharge method) as shown in FIG. 5.

As the droplet discharge method, various known techniques can be applied. Examples of the droplet discharge method include a piezoelectric method in which an ink is discharged using a piezo element as a piezoelectric element, and a method in which an ink is discharged by a bubble that is generated by heating the ink. Among these methods, the piezoelectric method has an advantage such as that the composition of an ink is not affected because no heat is applied to the ink. Therefore, the piezoelectric method described above is adopted for the head 70 shown in FIG. 5.

A main body 90 of the head 70 includes a reservoir 95 and a plurality of ink chambers 93 that is divaricated from the reservoir 95. The reservoir 95 serves as a flow channel to supply the ink 10 into each of the ink chambers 93.

On the bottom surface of the main body 90, a nozzle plate (not illustrated) constituting an ink discharge surface is attached. In the nozzle plate, a plurality of nozzles 91 for discharging the ink 10 is opened corresponding to each of the ink chambers 93. Toward the corresponding nozzle 91 from each of the ink chambers 93, an ink flow channel is formed. On the other hand, a vibrating plate 94 is attached to the top surface of the main body 90. The vibrating plate 94 constitutes a wall surface of each of the ink chambers 93. At the outer side of the vibrating plate 94, a piezo element 92 is disposed correspondingly to each of the ink chambers 93. The piezo element 92 is formed such that a piezoelectric material such as quartz crystal is interposed between a pair of electrodes (not illustrated). The pair of electrodes is coupled to a drive circuit 99.

When an electrical signal is inputted from the drive circuit 99 to the piezo element 92, the piezo element 92 is deformed and expanded or deformed and contracted. When the piezo element 92 is deformed and contracted, the pressure in the ink chamber 93 is lowered and therefore the ink 10 flows into the ink chamber 93 from the reservoir 95. On the other hand, when the piezo element 92 is deformed and expanded, the pressure in the ink chamber 93 is increased and therefore the ink 10 is discharged from the nozzle 91. The deformation amount of the piezo element 92 can be controlled by changing a voltage to be applied. Further, the deformation speed of the piezo element 92 can be controlled by changing the frequency of the voltage to be applied. That is, discharging conditions of the ink 10 can be controlled by controlling the voltage applied to the piezo element 92.

Therefore, the ink-jet device 50 provided with the head 70 as above can accurately discharge the ink 10 in a desired amount at a desired position on the ceramic green sheet 7. Further, since the conductive pattern forming ink of the first embodiment is used as the ink 10, the ink 10 is prevented from being dried in the head 70, thus preventing metal particles from being separated out. Therefore, the precursor 11 is accurately and easily formed as shown in FIG. 3A.

After the precursor 11 is formed as above, the ceramic green sheet 7 will be formed in a required number, for example, about 10 to 20 sheets, through the same steps.

Subsequently, PET films are removed from those ceramic green sheets 7, and the ceramic green sheets 7 are layered as shown in FIG. 2. Here, the ceramic green sheets 7 to be laminated are arranged so that the precursors 11 are coupled to one another as necessary through the contract 6 between the ceramic green sheets 7 disposed one above the other. Thereafter, the ceramic green sheets 7 are bonded to each other with a pressure while being heated at a temperature more than or equal to a glass-transition temperature of a binder included in the ceramic green sheets 7. The laminated body 12 is thus obtained.

Then, the laminated body 12 formed as above is subjected to heat treatment with a belt furnace or the like, for example. The ceramic green sheets 7 are thus sintered to be the ceramic substrates 2 (the wiring substrate of the fourth embodiment) as shown in FIG. 3B. Further, silver colloidal particles in the precursor 11 are sintered, thereby forming the circuit (conductive pattern) 5 including wiring patterns and electrode patterns. The laminated body 12 processed through the heat treatment as above becomes the laminated substrate 3 shown in FIG. 1.

Here, the temperature to heat the laminated body 12 is preferably more than or equal to a softening temperature of glass included in the ceramic green sheet 7, that is, more specifically, from 600 to 900 degrees Celsius inclusive. Further, as the heating conditions, the temperature is increased or decreased at an appropriate speed, and further, maintained for an appropriate period of time depending on the highest heating temperature, that is, the temperature from 600 to 900 degrees Celsius as above.

A glass component in the ceramic substrate 2 that is obtained can be thus softened by increasing the heating temperature up to the softening temperature of the glass, that is, the temperature range described above. Therefore, by cooling down the glass component to room temperature so as to harden it, the ceramic substrate 2 and the circuit (conductive pattern) 5 that constitute the laminated substrate 3 are further firmly bonded to each other.

Further, by heating the laminated body 12 in the temperature range as above, the ceramic substrate 2 that is obtained becomes a low temperature co-fired ceramic (LTCC) that is formed by being sintered at 900 degrees Celsius or less.

Here, metal particles included in the ink 10 deposited on the ceramic green sheet 7 are fused and continuously coupled to each other by the heat treatment, thereby exhibiting electrical conductivity.

Through such heat treatment, the circuits 5 are formed to be directly coupled with the contact 6 in the ceramic substrate 2, and thus electrically conducted with each other. Here, if the circuit 5 is simply placed on the ceramic substrate 2, the circuit 5 cannot securely have mechanical connection strength with the ceramic substrate 2, and therefore may be damaged on impact or the like. However, in the fourth embodiment, the glass included in the ceramic green sheet 7 is softened once and then hardened as described above, allowing the circuit 5 to firmly bond to the ceramic substrate 2. Therefore, the circuit 5 that is formed can also have mechanically high strength.

Through the heat treatment as above, the circuit 4 is concurrently formed with the circuit 5, thus providing the ceramic circuit substrate 1.

In the method for manufacturing the ceramic circuit substrate 1 as above, in particular, since the ink 10 (the conductive pattern forming ink of the invention) described above is deposited on the ceramic green sheet 7 in the manufacturing step for the ceramic substrate 2 constituting the laminated substrate 3, the conductive pattern forming ink 10 is favorably deposited on the ceramic green sheet 7 in a desired pattern. Therefore, the conductive pattern (circuit) 5 with high accuracy is formed.

While the preferred embodiments of the invention have been described, they are not intended to limit the invention.

For example, in the embodiments, a case where the colloidal liquid is used as a dispersion liquid in which metal particles are dispersed in a solvent has been described, however, the dispersion liquid is not necessarily the colloidal liquid.

Further, in the embodiments described above, a case where the conductive pattern forming ink includes the silver particles dispersed therein has been described, however, the conductive pattern forming ink may include metal particles other than silver particles. Examples of metals included in the metal particles include silver, copper, palladium, platinum, and gold or their alloys. These may be used singly or in combination of two or more. When the metal particles are made of an alloy, the alloy may include metals other than the above as long as a metal among the metals described above is used as a main constituent of the alloy. Further, an alloy made of the metals described above mixed with each other at an arbitrary ratio may be used. Furthermore, a liquid including mixed particles (e.g. silver particles, copper particles, and palladium particles are included at an arbitrary ratio) dispersed therein may be used. These metals have small resistivity and are stable because of not being oxidized by heat treatment. Therefore, using the metals can form a stable conductive pattern having low resistivity.

For example, in the embodiments, a case where the conductive pattern forming ink is applied to the ceramic formed body and sintered so as to form a ceramic substrate and a conductive pattern has been described, however, substrates other than the above may be used. As the substrate used for forming the conductive pattern is not particularly limited. Examples of materials for the substrate include a ceramic sintered body, an alumina sintered body, polyimide resin, phenol resin, glass epoxy resin, and glass. Alternatively, the conductive pattern forming ink may be directly applied on a ceramic substrate.

WORKING EXAMPLES

Hereinafter, the invention will be described in further detail by using working examples, but the invention is not limited to the examples.

[1] Preparation of Conductive Pattern Forming Ink

Each of conductive pattern forming inks of Examples and Comparative Examples is produced as below.

Examples 1 to 11

In 50 mL of water that was alkalified by adding 3 mL of a 10N—NaOH aqueous solution, 17 g of trisodium citrate dihydrate and 0.36 g of tannic acids were dissolved. Then, 3 mL of a 3.87 mol/L silver nitrate acid aqueous solution was added to the obtained solution and the solution was agitated for 2 hours, thus providing a silver colloidal liquid. The silver colloidal liquid having been obtained was desalinated until its electrical conductivity became 30 μS/cm or less through dialysis. After the dialysis, bulky metal colloidal particles were removed by centrifugal separation under conditions of 3000 rpm for 10 minutes.

To the silver colloidal liquid, inositol, a polyglycerol compound shown in Table 1, Surfynol 104PG50 (by Air Products and Chemicals, Inc.) and Olfine EXP4036 (by Nissin Chemical Industry Co., Ltd) that serve as an acetylene glycol based compound were added. If a pH of the silver colloidal liquid was not in a range from 6 to 11, the pH of the silver colloidal liquid was adjusted to be in the range from 6 to 11 by using a 1N-NaOH aqueous solution. Further, ion-exchanged water for concentration adjustment was added to the silver colloidal liquid, thus providing the conductive pattern forming ink.

Example 12

While 1000 mL of a 50 mmol/L silver nitrate acid aqueous solution was being agitated, 3.0 Og of mercaptoacetic acid as a sulfuric compound having a low molecular weight was added thereto. Thereafter, a pH of the aqueous solution was adjusted to 10.0 by adding 26 wt % ammonia water. Under a room temperature, 50 mL of a 400 mmol/L sodium borohydride aqueous solution was rapidly added to the aqueous solution above so as to produce a reduction reaction, forming the silver colloidal particles having particle surfaces covered with mercaptoacetic acid in the solution.

The colloidal liquid obtained as above was adjusted to pH 3.0 by using 20 wt % nitric acid. After the silver colloidal particles settled out, the colloidal liquid was filtered with a vacuum filter so as to separate the particles from the liquid, and the particles were washed with water until the electrical conductivity of the filtrate became 10.0 μS/cm or less, thus providing a wet cake of the silver colloidal particles.

The wet cake of the silver colloidal particles was added to water so that its concentration was 10 wt %, and was adjusted to pH 9.0 by adding 26 wt % ammonia water while being agitated. The silver colloidal particles were re-dispersed and then the liquid was concentrated, providing a silver colloidal liquid.

A conductive pattern forming ink was prepared as below in the same manner as in Example 1.

COMPARATIVE EXAMPLE 1

A conductive pattern forming ink was prepared as below in the same manner as in Example 1 except for adding no inositol.

COMPARATIVE EXAMPLE 2

A conductive pattern forming ink was produced in the same manner as in Example 1 except for adding no polyglycerol compound.

COMPARATIVE EXAMPLES 3 and 4

A conductive pattern forming ink was produced in the same manner as in Example 1 except for that the contents of the polyglycerol compound and inositol were changed as shown in Table 1.

COMPARATIVE EXAMPLE 5

A conductive pattern forming ink was produced in the same manner as in Example 1 except for that inositol was not added and the content of the polyglycerol compound was changed as shown in Table 1.

COMPARATIVE EXAMPLE 6

A conductive pattern forming ink was produced in the same manner as in Example 1 except for that the polyglycerol compound was not added and the content of inositol was changed as shown in Table 1.

Compositions of the conductive pattern forming inks according to Examples and Comparative Examples are shown in Table 1. In Table 1, a content of each material indicates an amount contained in the conductive pattern forming ink. X(A)[wt %] represents the content of the polyglycerol compound in the conductive pattern forming ink, while X(B) [wt %] represents the content of the inositol in the conductive pattern forming ink. Further, "H" represents the H in the Formula (I) described above. OH(A) represents the number of hydroxyl groups in one molecule of the polyglycerol compound, while OH(B) represents the number of hydroxyl groups in one molecule of inositol. Mw(A) represents the weight-average molecular weight of the polyglycerol compound, while Mw(B) represents the molecular weight of inositol. Furthermore, "A" represents polyglycerol #500 (a weight-average molecular weight of 462), "B" represents polyglycerol #300 (a weight-average molecular weight of 312), "C" represents polyglycerol #400 (a weight-average molecular weight of 370), "D" represents polyglycerol #800 (a weight-average molecular weight of 759), and "E" represents polyglycerol #3000 (a weight-average molecular weight of 3000).

TABLE 1

| | Silver Colloidal particles Content of [wt %] | Polyglycerol compound | | | | Inositol | | | Acetylene glycol based compound | | 1,3-propanediol Content [wt %] | Water Content [wt %] | X(A)/ X(B) | H |
|---|---|---|---|---|---|---|---|---|---|---|---|---|---|---|
| | | Type | Content X(A) [wt %] | Mw (A) | OH (A) [piece] | Content X(B) [wt %] | Mw (B) | OH (B) [piece] | Surfynol 104PG50 [wt %] | Olfine EXP4036 [wt %] | | | | |
| Example 1 | 40.0 | A | 9.0 | 462 | 8 | 6.0 | 180 | 6 | 0.02 | 0.006 | 5.0 | 40.0 | 1.50 | 0.36 |
| Example 2 | 40.0 | A | 18.0 | 462 | 8 | 4.5 | 180 | 6 | 0.02 | 0.006 | 5.0 | 32.5 | 4.0 | 0.46 |
| Example 3 | 40.0 | A | 4.0 | 462 | 8 | 18.0 | 180 | 6 | 0.02 | 0.006 | 5.0 | 33.0 | 0.22 | 0.67 |
| Example 4 | 40.0 | A | 0.5 | 462 | 8 | 20.0 | 180 | 6 | 0.02 | 0.006 | 5.0 | 34.5 | 0.03 | 0.68 |
| Example 5 | 40.0 | A | 21.0 | 462 | 8 | 2.0 | 180 | 6 | 0.02 | 0.006 | 5.0 | 32.0 | 10.5 | 0.43 |
| Example 6 | 40.0 | A | 35.0 | 462 | 8 | 1.5 | 180 | 6 | 0.02 | 0.006 | 5.0 | 18.5 | 23.33 | 0.66 |

TABLE 1-continued

| | Silver Colloidal particles Content of [wt %] | Polyglycerol compound | | | | Inositol | | | Acetylene glycol based compound | | 1,3-propanediol Content [wt %] | Water Content [wt %] | X(A)/ X(B) | H |
|---|---|---|---|---|---|---|---|---|---|---|---|---|---|---|
| | | Type | Content X(A) [wt %] | Mw (A) | OH (A) [piece] | Content X(B) [wt %] | Mw (B) | OH (B) [piece] | Surfynol 104PG50 [wt %] | Olfine EXP4036 [wt %] | | | | |
| Example 7 | 40.0 | A | 2.0 | 462 | 8 | 2.5 | 180 | 6 | 0.02 | 0.006 | 5.0 | 50.5 | 0.80 | 0.12 |
| Example 8 | 40.0 | B | 9.0 | 312 | 6 | 6.0 | 180 | 6 | 0.02 | 0.006 | 5.0 | 40.0 | 1.5 | 0.37 |
| Example 9 | 40.0 | C | 9.0 | 370 | 7 | 6.0 | 180 | 6 | 0.02 | 0.006 | 5.0 | 40.0 | 1.5 | 0.37 |
| Example 10 | 40.0 | D | 9.0 | 759 | 12 | 6.0 | 180 | 6 | 0.02 | 0.006 | 5.0 | 40.0 | 1.5 | 0.34 |
| Example 11 | 40.0 | E | 9.0 | 3000 | 22 | 6.0 | 180 | 6 | 0.02 | 0.006 | 5.0 | 40.0 | 1.5 | 0.27 |
| Example 12 | 40 | A | 9.0 | 462 | 8 | 6.0 | 180 | 6 | 0.02 | 0.006 | 5.0 | 40.0 | 1.5 | 0.36 |
| Comparative Example 1 | 40.0 | A | 9.0 | 462 | 8 | — | — | — | 0.02 | 0.006 | 5.0 | 46.0 | — | 0.16 |
| Comparative Example 2 | 40.0 | — | — | — | — | 6.0 | 180 | 6 | 0.02 | 0.006 | 5.0 | 49.0 | — | 0.20 |
| Comparative Example 3 | 40.0 | A | 9.0 | 462 | 8 | 18.0 | 180 | 6 | 0.02 | 0.006 | 5.0 | 28.0 | 0.50 | 0.76 |
| Comparative Example 4 | 40.0 | A | 1.0 | 462 | 8 | 0.5 | 180 | 6 | 0.02 | 0.006 | 5.0 | 51.5 | 2.0 | 0.03 |
| Comparative Example 5 | 40.0 | A | 25.0 | 462 | 8 | — | — | — | 0.02 | 0.006 | 5.0 | 30.0 | — | 0.43 |
| Comparative Example 6 | 40.0 | — | — | — | — | 14.0 | 180 | 6 | 0.02 | 0.006 | 5.0 | 41.0 | — | 0.47 |

[2] Producing Ceramic Green Sheet

First, a ceramic green sheet (ceramic formed body) was prepared as follows.

A ceramic powder made of alumina ($Al_2O_3$), titanium oxide ($TiO_2$) or the like having an average particle diameter of from about 1 μm to about 2 μm and a glass powder made of borosilicate glass or the like having an average particle diameter of from about 1 μm to about 2 μm were mixed at a weight ratio of 1:1. Then, polyvinyl butyral serving as a binder (binding agent), and dibutylphthalate serving as a plasticizer were added to the mixture, and then the resulting mixture was mixed and agitated, providing a slurry. The resulting slurry was formed in a sheet-like shape as a ceramic green sheet on a PET film by employing a doctor blade, and the sheet was cut into a square having a side length of 200 mm to be used.

[3] Evaluation of Ink Storage Stability

Right after being produced, each of the conductive pattern forming inks obtained in Examples and Comparative Examples was dropped one each on a glass substrate and left under an atmosphere at a temperature of 30 degrees Celsius and a humidity of 55%. After being left, each of the conductive pattern forming inks having been dropped was examined whether keeping a liquid state or not by inserting a glass rod into the ink. The number of days until the ink was not able to keep a liquid state after the ink was left was evaluated as a liquid state period based on criteria at 4 levels.

A: Liquid state period is 25 days or more.
B: Liquid state period is 10 days or more and less than 25 days.
C: Liquid state period is 5 days or more and less than 10 days.
D: Liquid state period is less than 5 days.

[4] Evaluation of Droplet Discharge Stability

Right after being produced, each of the conductive pattern forming inks obtained in Examples and Comparative Examples was supplied to an ink-jet device similar to the one shown in FIGS. 4 and 5. First, after drawing with the ink-jet device including the conductive pattern forming ink as above was conducted, it was confirmed that the ink was stably discharged. Then, the ink-jet device was left, in a standby state in which the ink-jet head was out of a drawing position, in a Class 100 clean room environment at a room temperature of 25 degrees Celsius and a relative humidity of 55% for 2 weeks. Next, the ink-jet device was turned on and allowed to draw a solid pattern on 20 of ceramic green sheets that were obtained as above. When the ink discharge was unstable, the ink discharge was recovered to a stable state by using a predetermined cleaning mechanism installed in the ink-jet device. After the above operations, the discharge stability was evaluated based on the following evaluation criteria.

A: Ink is stably discharged without nozzle clogging during drawing (good discharge stability).
B: Cleaning operation is required two times or less to obtain stable ink discharge after nozzle clogging during drawing (practically usable).
C: Cleaning operation is required three times or more to obtain stable ink discharge after nozzle clogging during drawing (practically acceptable).
D: Nozzle clogging occurred during drawing is not recovered by cleaning operation (unsuitable for practical use).

Further, the same evaluation was performed in a case where the same operations were carried out after the standby state of 30 days.

[5] Production and Evaluation of Wiring Substrate

Each of the conductive pattern forming inks obtained in Examples and Comparative Examples was put into a droplet discharge device similar to the one shown in FIGS. 4 and 5.

Then, the ceramic green sheets described above were heated to and maintained at 60 degrees Celsius. Droplets each of 15 ng were subsequently discharged from each discharge nozzle so as to draw 20 lines (precursor) having a line width of 40 μm, a thickness of 15 μm, and a length of 10.0 cm. A distance between the lines was set to be 5 mm. Then, the ceramic green sheets having the lines formed thereon were loaded in a drying furnace and heated under the conditions at 60 degrees Celsius for 30 minutes so as to be dried.

The ceramic green sheets having the lines formed thereon according to the above were regarded as first ceramic green sheets. With each of the inks, 20 of the first ceramic green sheets were formed. Further, each of the sheets was examined whether it had cracks or not. The results are listed in Table 2. Table 2 shows the number of nondefective ceramic sheets having no cracks in the lines among the first ceramic green sheets.

Next, in another ceramic green sheet, through holes with a diameter of 100 μm were formed at both edges of the metal wiring lines by punching with a mechanical puncher or the like, thus forming 40 through holes in total. The through holes were filled with each of the conductive pattern forming inks obtained in Examples and Comparative Examples, thereby forming contacts (via holes). Further, a pattern having a 2 mm square was formed on the contact (via hole) by using each of the conductive pattern forming inks obtained in Examples and Comparative Examples with the droplet discharge device so as to form a terminal portion.

The ceramic green sheets having the terminal portion formed thereon were regarded as second ceramic green sheets.

Then, one of the first ceramic green sheets was laminated under one of the second ceramic green sheets. Further, two ceramic green sheets that have not been processed were laminated thereto as a reinforcement layer, thereby providing a raw laminated body. Then, 20 blocks of the raw laminated body were formed for each of the inks so as to correspond to every one of 20 of the first ceramic green sheets.

Then, the raw laminated body was pressed with a pressure of 300 kg/cm2 at 95 degrees Celsius for 60 seconds. Thereafter, the raw laminated body was sintered based on a sintering profile in which the raw laminated body was continuously heated at a rate of temperature rise of 75 degrees Celsius per hour for about 7 hours, at a rate of temperature rise of 5 degrees Celsius per hour for about 8 hours, and at a rate of temperature rise of 75 degrees Celsius per hour for about 4 hours, and after the elevated temperature process, was maintained at a highest temperature of 890 degrees Celsius for 30 minutes. A ceramic circuit board was thus obtained.

After being cooled down, each ceramic circuit substrate was subjected to a check on conductivity by placing a tester between terminal portions formed on 20 of the conductive patterns. A ceramic circuit substrate having 100% electrical conductivity was regarded as a non-defective substrate. Here, the electrical conductivity was obtained by dividing the number of conductive patterns having electrical conductivity in each of the ceramic circuit substrates by the number of conductive patterns (20 patterns) having been formed.

The results are shown in Table 2.

TABLE 2

| | Droplet discharge stability | | | Number of non-defectives after drawing and drying [piece] | Number of non-defectives after sintering [piece] |
|---|---|---|---|---|---|
| | Storage stability | 5-day period | 30-day period | | |
| Example 1 | A | A | A | 20 | 20 |
| Example 2 | A | A | A | 18 | 17 |
| Example 3 | A | A | A | 20 | 18 |
| Example 4 | A | A | A | 18 | 15 |
| Example 5 | B | B | B | 17 | 13 |
| Example 6 | B | B | C | 14 | 10 |
| Example 7 | B | A | B | 18 | 12 |
| Example 8 | A | A | A | 20 | 14 |
| Example 9 | A | A | A | 20 | 20 |
| Example 10 | A | A | A | 20 | 20 |
| Example 11 | A | B | B | 16 | 14 |
| Example 12 | A | A | A | 20 | 20 |
| Comparative Example 1 | D | C | D | 10 | 5 |
| Comparative Example 2 | B | A | B | 10 | 2 |
| Comparative Example 3 | A | A | A | 18 | 4 |
| Comparative Example 4 | D | C | D | 8 | 2 |
| Comparative Example 5 | A | D | D | 6 | 5 |
| Comparative Example 6 | A | A | A | 12 | 4 |

As shown in Table 2, all the conductive pattern forming inks of the invention attained the excellent storage stability and discharge stability.

Further, as shown in Table 2, the ceramic circuit substrate having lines formed by using each of the conductive pattern forming inks of Comparative Examples had many cracks in the lines, and further, the lines themselves likely lost their shapes after drawing and drying in producing the ceramic circuit substrate. On the other hand, the ceramic circuit substrate having lines formed by using each of the conductive pattern forming inks of Examples hardly had cracks in the lines. Further, compared to the cases of Comparative Examples, obviously, the lines were maintained without loosing their shapes.

Further, as shown in Table 2, at a disconnection check with the tester after the ceramic circuit substrates having lines formed by using each of the conductive pattern forming inks of Comparative Examples was sintered, electrical conductivity between the lines was hardly confirmed. On the contrary, the ceramic circuit substrate having lines formed by using each of the conductive pattern forming inks of Examples had a large number of lines exhibiting conductivity, thereby providing the metal wiring lines that were extremely favorable. Resulting from examining the conductivity failures, it was confirmed that the conductivity failures were caused by cracks, and disconnections occurred during the sintering.

Further, when the content of the silver colloidal particles in the inks was changed to 20 wt % and 30 wt %, the same results as above were obtained.

What is claimed is:

1. A conductive pattern forming ink for forming a conductive pattern on a substrate by a droplet discharge method, comprising:
    metal particles having an average diameter in a range from 1 nm to 100 nm;
    an aqueous dispersion medium in which the metal particles are dispersed;
    inositol; and
    a polyglycerol compound having a polyglycerol skeleton, wherein H shown in the following formula (I) is 0.050 to 0.70;

$$H = \frac{OH(A)}{Mw(A)} X(A) + \frac{OH(B)}{Mw(B)} X(B) \qquad \text{Formula (I)}$$

wherein OH(A) represents an average number of hydroxyl groups in one molecule of the polyglycerol compound, Mw(A) represents a weight-average molecular weight of the polyglycerol compound, X(A) represents a content of the polyglycerol compound in the conductive pattern forming ink in weight percent; and OH(B) represents a number of hydroxyl groups in one molecule of the inositol, Mw(B) represents a molecular weight of the inositol, and X(B) represents a content of the inositol in the conductive pattern forming ink in weight percent.

2. The conductive pattern forming ink according to claim 1, wherein the X(A) and the X(B) satisfy a relation of $0.10 \leqq X(A)/X(B) \leqq 20$.

3. The conductive pattern forming ink according to claim 1, wherein the X(A) is 1.0 wt % to 20 wt %.

4. The conductive pattern forming ink according to claim 1, wherein the X(B) is 1.0 wt % to 15 wt %.

5. The conductive pattern forming ink according to claim 1, wherein the polyglycerol compound is polyglycerol.

6. The conductive pattern forming ink according to claim 1, wherein the Mw(A) is 300 to 3000.

7. The conductive pattern forming ink according to claim 1, wherein a total content of the inositol and the polyglycerol compound in the conductive pattern forming ink is 2.0 wt % to 35 wt %.

8. The conductive pattern forming ink according to claim 1, wherein the substrate is formed by degreasing and sintering a ceramic formed body made of a material containing ceramic particles and a binder so as to have a sheet like shape, and the conductive pattern forming ink is applied to the ceramic formed body by the droplet discharge method.

9. The conductive pattern forming ink according to claim 1, wherein the conductive pattern forming ink is a colloidal liquid in which metal colloidal particles composed of the metal particles and a dispersant adsorbing onto surfaces of the metal particles is dispersed in the aqueous dispersion medium.

10. The conductive pattern forming ink according to claim 9, wherein the dispersant includes one of hydroxy acid and salt of hydroxy acid that having in total three or more of at least one COOH group and at least one OH group, and a number of COOH groups is equal to or larger than a number of OH groups.

11. The conductive pattern forming ink according to claim 9, wherein the dispersant includes one of mercapto acid and salt of mercapto acid having in total two or more of at least one COOH group and at least one SH group.

12. The conductive pattern forming ink according to claim 9, wherein the colloidal liquid has a pH of 6 to 12.

13. A conductive pattern formed from the conductive pattern forming ink according to claim 1.

14. The conductive pattern forming ink according to claim 9, wherein a content of the metal colloidal particles in the conductive pattern forming ink is in a range from about 1 wt % to about 60 wt %.

15. The conductive pattern forming ink according to claim 14, wherein the content of the metal colloidal particles in the conductive pattern forming ink is in a range from about 10 wt % to about 50 wt %.

* * * * *